United States Patent
Farmahini et al.

(10) Patent No.: US 11,748,028 B2
(45) Date of Patent: *Sep. 5, 2023

(54) DATA PROCESSING ON MEMORY CONTROLLER

(71) Applicant: Google LLC, Mountain View, CA (US)

(72) Inventors: Amin Farmahini, Sunnyvale, CA (US); Benjamin Steel Gelb, Sunnyvale, CA (US); Gurushankar Rajamani, Sunnyvale, CA (US); Sukalpa Biswas, Fremont, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,802

(22) Filed: Nov. 23, 2022

(65) Prior Publication Data

US 2023/0161498 A1 May 25, 2023

Related U.S. Application Data

(63) Continuation of application No. 17/348,558, filed on Jun. 15, 2021, now Pat. No. 11,513,724, which is a continuation of application No. 16/930,172, filed on Jul. 15, 2020, now Pat. No. 11,137,936.

(60) Provisional application No. 62/964,031, filed on Jan. 21, 2020.

(51) Int. Cl.
*G06F 3/00* (2006.01)
*G06F 3/06* (2006.01)

(52) U.S. Cl.
CPC .......... *G06F 3/0655* (2013.01); *G06F 3/0605* (2013.01); *G06F 3/0679* (2013.01)

(58) Field of Classification Search
CPC ..... G06F 3/0655; G06F 3/0605; G06F 3/0679
See application file for complete search history.

(56) References Cited

U.S. PATENT DOCUMENTS 5,343,455 A 8/1994 Takeuchi et al.
8,918,589 B2 12/2014 Asai et al.
(Continued)

FOREIGN PATENT DOCUMENTS

| TW | I287711 B | 10/2007 |
|---|---|---|
| WO | WO 2010/143209 | 12/2010 |
| WO | WO 2012/068494 A2 | 5/2012 |

OTHER PUBLICATIONS

[No. Author], "3D Stacked Memory", Patent Landscape Analysis, 2015, 23 pages.
(Continued)

*Primary Examiner* — Craig S Goldschmidt
(74) *Attorney, Agent, or Firm* — Fish & Richardson P.C.

(57) ABSTRACT

Methods, systems, and apparatus, including computer programs encoded on computer storage media, for processing data on a memory controller. One of the methods comprises obtaining a first request and a second request to access respective data corresponding to the first and second requests at a first memory device of the plurality of memory devices; and initiating interleaved processing of the respective data; receiving an indication to stop processing requests to access data at the first memory device and to initiate processing requests to access data at a second memory device, determining that the respective data corresponding to the first and second requests have not yet been fully processed at the time of receiving the indication, and in response, storing, in memory accessible to the memory controller, data corresponding to the requests which have not yet been fully processed.

20 Claims, 5 Drawing Sheets

(56) References Cited

U.S. PATENT DOCUMENTS

| | | | |
|---|---|---|---|
| 9,552,206 B2 | 1/2017 | Johnson et al. | |
| 9,851,905 B1* | 12/2017 | Ramalingam | G06F 3/0685 |
| 9,875,156 B2 | 1/2018 | Sharon et al. | |
| 2008/0250212 A1* | 10/2008 | Asaro | G06F 12/0607 |
| | | | 711/157 |
| 2011/0055453 A1 | 3/2011 | Bennet | |
| 2012/0054455 A1 | 3/2012 | Wang et al. | |
| 2015/0100746 A1* | 4/2015 | Rychlik | G06F 12/0607 |
| | | | 711/157 |
| 2015/0301752 A1* | 10/2015 | Liang | G11C 8/18 |
| | | | 711/105 |
| 2016/0210050 A1 | 7/2016 | Hyun et al. | |

OTHER PUBLICATIONS

Akin et al., "Data Reorganization in Memory Using 3D-stacked DRAM" 42nd Annual International Symposium on Computer Architecture, 2015, 13 pages.

Ausavarungnirun et al., "Staged Memory Scheduling: Achieving High Performance and Scalability in Heterogeneous Systems" IEEE, 2012, 12 pages.

Extended European Search Report in European Patent Application No. 20207348.2, dated Apr. 14, 2021, 14 pages.

Guo et al., "A Requests Bundling DRAM Controller for Mixed-Criticality Systems" IEEE, 2017, 12 pages.

Hadidi et al., "Demystifying the Characteristics of 3D-Stacked Memories: A Case Study for Hybride Memory Cube" arXiv, Oct. 2017, 10 pages.

Kim et al., "A Predictable and Command-Level Priority-Based DRAM Controller for Mixed-Criticality Systems" IEEE, 2015, 10 pages.

Lee et al., "Simultaneous Multi-Layer Access: Improving 3D-Stakced Memory Bandwidth at Low Cost" ACM Transactions on Architecture and Code Optimization, 2015, 29 pages.

Zhang et al., "A Customized Design of DRAM Controller for On-Chip 3D Dram Stacking" IEEE, 2020, 4 pages.

Zhu et al., "A 3D-Stacked Logic-in-Memory Accelerator for Application-Specific Data Intensive Computing" IEEE, 2013, 7 pages.

Extended European Search Report in European Patent Application No. 23163764.6, dated Jul. 6, 2023, 16 pages.

* cited by examiner

DATA PROCESSING ON MEMORY CONTROLLER

CROSS-REFERENCE TO RELATED APPLICATIONS

This is a continuation of U.S. application Ser. No. 17/348,558, filed on Jun. 15, 2021, which is a continuation of U.S. application Ser. No. 16/930,172, filed on Jul. 15, 2020 (now U.S. Pat. No. 11,137,936), which claims priority to U.S. Provisional Application No. 62/964,031, filed on Jan. 21, 2020. The disclosures of the prior applications are considered part of and are incorporated by reference in the disclosure of this application.

BACKGROUND

This specification relates to memory controllers. A memory controller can be logic circuitry configured to access data by reading from and writing to memory devices. The memory controller maps data stored in memory devices and identifies the data by address in the accessed memory.

Depending on the type of memory device, e.g., DRAM devices, interfacing with the memory controller, the memory controller is also responsible for periodically refreshing and maintaining data in memory, and for enforcing certain data-access constraints for accessing data and that is specified by the hardware of certain types of memory devices, e.g., 3D-stacked DRAM devices. Certain types of memory devices are also subject to data-access constraints that prevent the same device—or in some cases, memory banks on the same device—from being accessed by the memory controller in successive clock cycles. Despite these constraints, 3D-stacked DRAM devices are valued for their speed and reduced-power consumption over other types of memory devices.

SUMMARY

This specification describes technologies for processing data by a memory controller. A memory controller receives requests to access and process data of different sizes from a first memory device of a plurality of memory devices. The controller processes the data corresponding to the requests by generating chunks of data that alternate between data corresponding to two or more requests. Periodically, the memory controller receives indications to stop accessing data from one memory device, and to begin accessing data at another memory device. When the memory controller receives an indication, the controller determines whether remaining portions of data corresponding to the current requests being processed have not yet been fully processed, and in response, "chops off" the remaining portion by storing the remaining portion or its address in memory internal to the memory controller, e.g., SRAM tables within the memory controller. By chopping off remaining portions, the memory controller can more efficiently process data from memory devices, especially memory devices that prohibit accessing a same device or same bank of memory on a device in successive cycles.

Previously, memory controllers finished processing the remaining portions of data for requests to a first memory device, before beginning to access a second memory device. One problem that occurs with this approach is that if remaining portions of the requests are of different sizes, then eventually the request with the longer remaining portion will be processed without an accompanying request. Not interleaving the multiple requests from the same memory device can result in "bubbles" of idle cycles in the processing pipeline of the memory controller. Bubbles of idle cycles can additionally translate to bubbles in the utilization of a data communication bus between a controller and the different memory devices, degrading performance. Similar bubbles occur when a controller attempts to switch between reading and writing data on the same memory device.

Instead, the memory controller proceeds to access data from a second memory device, until receiving an indication to stop accessing the second memory device and to begin accessing the first memory device. The memory controller determines whether a portion of data accessed from the first memory device has been previously "chopped off" and stored in memory internal to the memory controller. In response, the memory controller processes the remaining portion before receiving new requests from the first memory device.

Because the memory controller enforces constraints to ensure that data is accessed evenly across all memory devices, after receiving an indication to stop accessing the first memory device, the memory controller cannot receive a new request from the first memory device to accompany the remaining portion of the longer request. Further, if the memory controller alternated requests between the data for the longer request and data for a request from the second memory device, the memory controller would create bubbles of cycles for accessing different memory devices on subsequent cycles. The bubbles are worse for architectures of memory devices sharing the same data communications bus, e.g., 3D-stacked memory devices, because different memory devices cannot be accessed in successive cycles.

In general, one innovative aspect of the subject matter described in this specification can be embodied in methods that include the actions of, while processing the requests, receiving, by the memory controller, an indication to stop processing requests to access the first memory device, and to initiate processing requests to access a second memory device of the plurality of memory devices. The controller, after receiving the indication, determines that the first and the second request have not been full processed, and in response, stores, in memory accessible to the memory controller, data identifying data corresponding to the requests which has not yet been fully processed. The identifying data can be one or more memory addresses identifying portions of the data corresponding to a request stored in a memory controller that has not yet been fully processed. In some implementations, the identifying data is the remaining portion of data corresponding to the requests that has not yet been fully processed. In those implementations, the remaining portion is stored in memory accessible to the memory controller.

Other implementations of this aspect include corresponding computer systems, apparatus, and computer programs recorded on one or more computer storage devices, each configured to perform the actions of the methods.

After storing the remaining portion of data corresponding to the requests from the first memory device, the memory controller begins to process data corresponding to requests from a second memory device. The memory controller initiates interleaved processing of requests from the second memory device, until receiving a second indication to stop accessing data from the second memory device. Upon receiving the second indication, the memory controller determines whether currently processed requests from the second memory device have not yet been fully processed, and in response stores the remaining portions of the requests in memory. Alternatively, the memory controller stores addresses corresponding to the remaining portions in memory internal to the memory controller.

The second indication is an indication to the memory controller to begin accessing data from another memory device. For example, the other memory device can be the first memory device, or a third memory device of the plurality of memory devices. If the memory controller receives the indication to begin accessing data from the first memory device, the memory controller determines whether the first and the second requests have been fully processed, and if not, resumes interleaved processing beginning with the previously stored remaining portions.

If the second indication is an indication to the memory controller to begin a third memory device, the memory controller begins to access data stored in the third memory device. While processing data for the requests from the third memory device, the memory controller has stored the remaining portions of data corresponding to the requests from the first and the second memory devices. Also while processing data from the third memory device, the memory controller can receive a third indication. The third indication is an indication to stop accessing data from the third memory device, and to begin accessing data from another memory device, e.g., the first memory device, the second memory device, or a not-yet accessed fourth memory device.

In some implementations, rather than chopping off and storing data for both requests after receiving an indication, the memory controller continues to process the remaining portions of the data for the requests until one of the requests is fully processed. Then, the memory controller stores the remaining portion—or its corresponding address—of the data for the other request. In this way, the memory controller balances switching between memory devices while also reducing latency in fulfilling individual requests that were otherwise close to fully processed before the memory controller received the indication to switch accessing memory devices.

In some implementations, instead of receiving an indication to switch memory devices, the memory controller receives an indication to switch reading/writing modes. Some memory architectures impose a constraint preventing data from being read from and written to (or vice versa) in successive cycles. The switch in mode also generates a bubble of cycles during which the memory controller is not processing data. By the same techniques described in this specification, below, the memory controller can reduce the number of bubbles caused by switching the read/write mode on the memory controller.

The subject matter described in this specification can be implemented in particular implementations so as to realize one or more of the following advantages. A memory controller can more efficiently process requests for data of different sizes on a plurality of memory devices. In general, any memory controller configured to process mixed-size requests can benefit from improved bandwidth utilization by implementation of the techniques of this specification. Memory architectures that prohibit successive accesses of data to the same device and/or memory bank, e.g., high bandwidth memory, can be accessed more efficiently by reducing bubbles of idle cycles. On average, latency in data retrieval is reduced because bandwidth utilization is higher. As a result of higher bandwidth usage, requests can be processed at a higher average rate and spend less time idle in queue.

Existing controllers can be augmented with minimal modification to implement the logic for processing requests as described in this specification. These improvements can be realized regardless of the nature of the data of the requests, or the nature of the processing performed by target devices for the requests. Existing software written to interface with the memory devices and controller does not need to be modified to implement these techniques.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
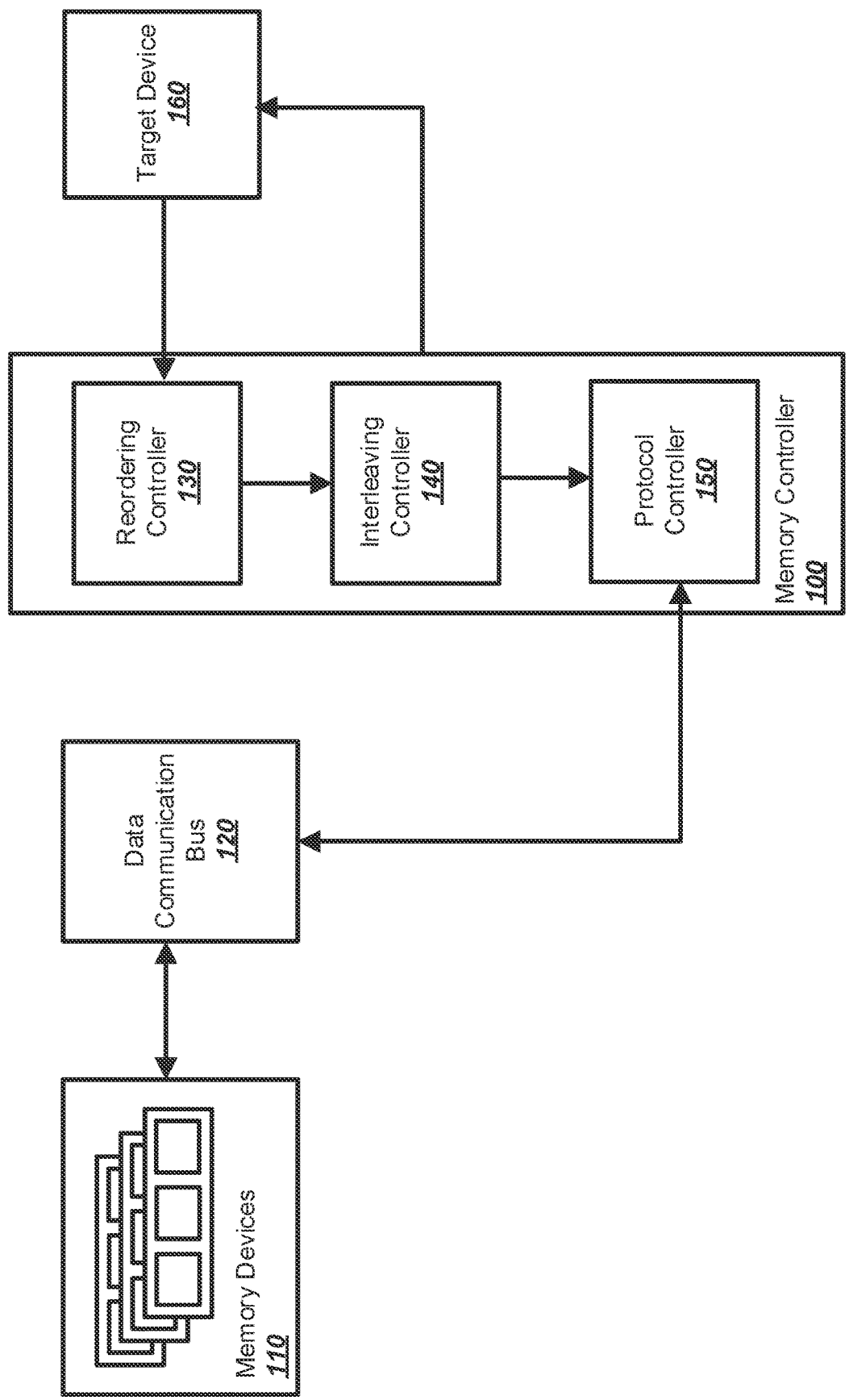
FIG. 1 shows an example memory controller coupled to memory devices through a data communication bus.

FIG. 1 shows an example memory controller 100 coupled to memory devices 110 through a data communication bus 120. The controller 100 implements reordering controller 130, interleaving controller 140, and protocol controller 150, each of which being special-purpose logic circuitry configured to perform respective operations described in detail, below. In addition, the controller 100 is communicatively coupled to a target device 160, which is configured to send requests to access data stored in the memory devices 110 and to receive the output of the memory controller 100 after performing processing of data stored in the memory devices 110. Requests to access data stored in the memory devices 110 include read and write requests. Data requested to be accessed by the target device 160 can vary in size from request-to-request.

The memory controller 100 can be implemented as special-purpose logic circuitry on or off a processing unit. In some implementations, the memory controller 100 is implemented as an integrated circuit (a "chip") that is integrated as part of a processing unit of a computer. The processing unit can be any suitable type of processing unit, e.g., a central processing unit (CPU), a graphics processing unit (GPU), field-programmable gate array (FGPA) or application-specific integrated circuit (ASIC), such as a tensor processing unit (TPU).

The memory controller 100 can be integrated as part of a CPU serving as a host processing unit for a hardware accelerator. A hardware accelerator can have a host CPU for general processing of data before the data is processed by the hardware accelerator. For example, the host CPU may be responsible for receiving data received as network traffic in a network that includes the host CPU, and for streaming the received data to the hardware accelerator. As described in more detail below, in implementations in which the host CPU implements the memory controller 100, the memory controller performs interleaved processing of data received from the memory devices 110, and accesses data in the memory devices 110 according to the requests interleaved in the interleaved output.

In this specification, a "memory device" refers to a storage device configured to store data which can be read from or written to by the memory controller 100. A memory device is organized as a series of ranks, banks, rows, and columns. A memory device has one or more ranks, and each rank represents a plurality of memory banks. Each memory bank is separated into rows and columns, each representing a physical location on the device in which memory can be stored.

In some implementations, the memory controller is implemented on a chip separate from a chip implementing a processing unit, but nonetheless is communicatively coupled through physical connections, e.g., a data bus or physical connections like wires, or otherwise communicatively coupled wirelessly to the memory devices 110.

The memory controller 100 can access data stored in a memory device by address referencing the location of data to-be-accessed, according to an address scheme by bank, row, and column of the location of the targeted data. For ease of explanation, each memory device is assumed to have only one rank, but in some implementations the address scheme also references locations by rank on a device having more than one rank. The number of banks—and whether each bank can be accessed simultaneously or not—depends on the type of memory of the device.

The memory devices 110 can be implemented: (i) as separate chips communicatively coupled by the data communication bus 120; (ii) as part of a single chip; or (iii) a combination of both. The memory devices 110 can be devices of different memory types, e.g., one or more DRAM, SRAM, resistive RAM (ReRAM), magneto-resistive RAM (MRAM), ferro-electric RAM (FRAM), spin torque transfer MRAM (STT-MRAM), phase change memory (PCM), double data rate memory (DDR, e.g., DDR4), including graphics DDR memory (GDDR, e.g., GDDR5), and low-power DDR (LPDDR, e.g., LPDDR5), and conductive bridge RAM (CBRAM). The memory devices 110 can also include non-volatile memory devices.

In some implementations, each of the memory devices 110 can be physically connected to one another using a 3D die-stacking technique. The memory devices can be stacked according to any suitable technique, e.g., wafer-to-wafer bonding or through-silicon via (TSV). Some examples of 3D-stacked DRAM include high bandwidth memory (HBM) and hybrid memory cube (HMC).

3D-stacked memory devices share a same data communication bus for communicating with a memory controller, and data accesses to different devices are serialized rather than performed in parallel; the memory controller 110 takes at least one cycle of computation time to switch accessing data from one memory device to another memory device. The memory controller 110, through its reordering controller 130, is configured to periodically switch from one memory device to another to ensure that data is accessed and processed across all devices, instead of only to a single device.

The memory devices 110 store data to be processed by the target device 160. For example, the data can represent inputs to a machine learning model that the target device 160 is configured to process to generate a corresponding output. The target device 160 can be any suitable computing device configured to receive data for processing as an output generated by the memory controller 100. In some implementations, the target device 160 is a hardware accelerator, e.g., a TPU.

Requests to process data can be initially loaded into the memory devices 110 according to a client application on one or more client computers. The requests correspond to segments of data to be processed by the target device 160. The request can specify the size of the data corresponding to the request. Data corresponding to requests are loaded into the memory devices 110, either using the memory controller 100 or by any other suitable technique.

The reordering controller 130 of the memory controller 100 is configured to obtain new requests for the memory controller 100 to process. The reordering controller 130 can use any suitable technique for selecting new requests to process by the memory controller 100. In general, the reordering controller 130 can store requests received by the target device 160 as a "pool" of requests, implemented for example as a queue or as a map table.

The reordering controller 130 can apply any suitable technique for determining which requests to select from the pool. For example, the reordering controller 130 can apply a first-in-first-out or first-in-last-out approach to selecting new requests. In some implementations, the reordering controller 130 selects new requests according to priority levels for each request. The priority levels can be user-assigned, assigned by the target device 160, assigned by the reordering controller 130 or other system communicatively coupled to the controller 100, or some combination of the preceding. The reordering controller 130 is also responsible for enforcing data-access constraints and controller constraints corresponding to the memory devices 110.

A controller constraint refers to a constraint the memory devices 110 imposes by virtue of its hardware on data accesses, i.e., data reads or writes, to and from the memory devices 110. Another controller constraint is a constraint in which the memory controller 100 cannot access different rows of the same bank of a memory device in successive cycles. A data-access constraint is a timing in which the memory controller 100 periodically stops accessing data from one memory device, and starts accessing data from another memory device. Data-access constraints ensure that all memory devices are periodically accessed by the memory controller 100, given there are pending requests to those memory devices.

The interleaving controller 140 of the memory controller 100 is configured to perform interleaved processing of the data corresponding to the requests selected by the reordering controller 130. Interleaved processing refers to the process performed by the memory controller 100 of accessing data in the memory devices 110 by alternating between interleaved requests. The memory controller 100 generates an interleaved output of data chunks of a uniform size. For example, the memory controller can generate an interleaved output of 32-byte chunks, alternating between data corresponding to the first, second, and third requests, and the memory controller processes the requests according to the alternating interleaved output. By interleaving data corresponding to two or more requests, the memory controller can service requests more efficiently among memory devices that are configured to not be read from or written to in successive cycles by the memory controller. Without interleaving, "bubbles" or idle clock cycles are wasted when a memory controller waits one or more cycles before being able to read from or write to the same memory device again. In some implementations, memory devices implement multiple banks of memory, where the memory controller is prohibited from reading from or writing to the same bank of memory in successive clock cycles.

The protocol controller 150 of the memory controller 100 is configured to interface with the target device 160 to access data on the memory devices 110 according to the interleaved output processed by the controller 100. As the protocol controller 150 accesses data according to the requests of the interleaved output, the protocol controller 150 can stream the accessed data to the target device 160. While only the single target device 160 is shown in FIG. 1, in some implementations the protocol controller 150 is configured to stream accessed data to multiple target devices, applying any suitable technique for distributing the controller output, either synchronously or asynchronously, across each of the multiple devices. In some implementations, each target device receives the same output. Alternatively, each target device receives a portion of the accessed data as it is streamed out by the memory controller 100.

In some implementations, the interleaved data is streamed to the target device 160 as the memory controller alternates chunks of data from the memory devices 110. By streaming the data to the target device 160, the target device 160 can begin processing the chunks of data earlier and without waiting for the memory controller to finish the interleaved output corresponding to the received requests.

Figure 2:
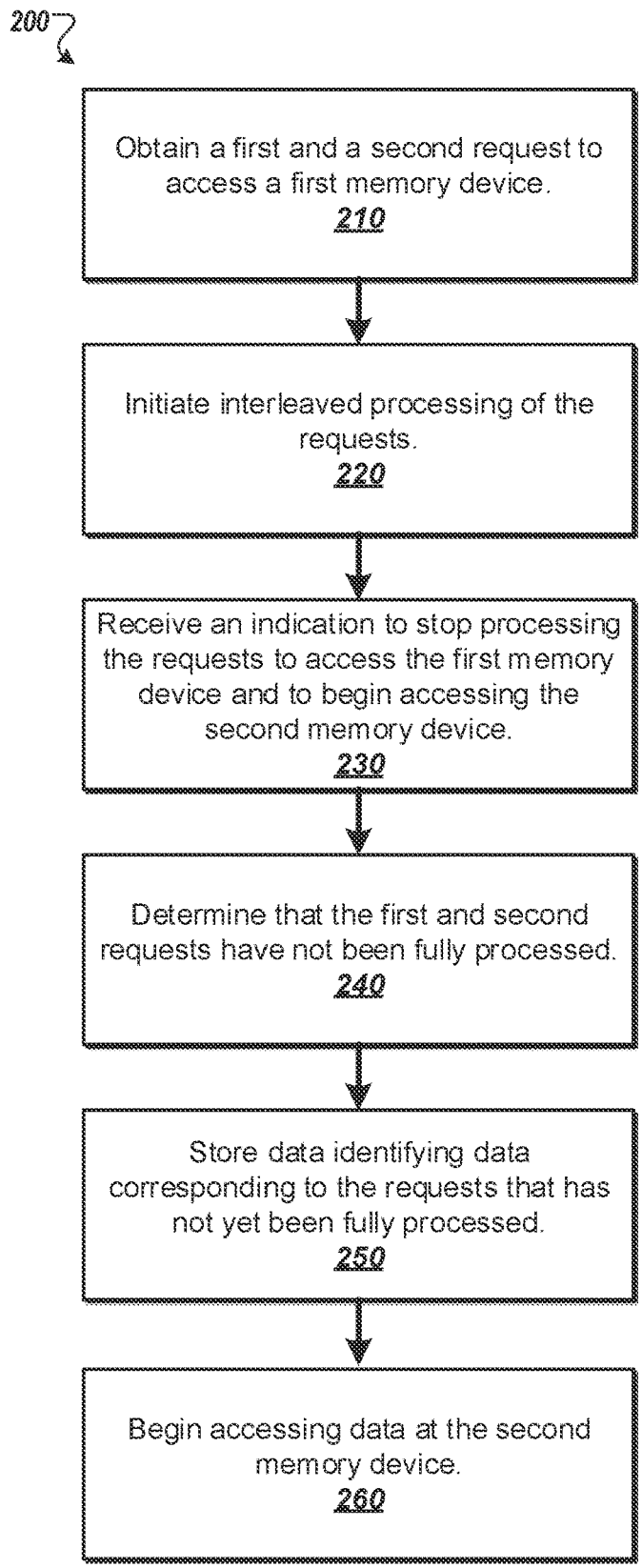
FIG. 2 is a flowchart of an example process for processing data on a memory controller.

FIG. 2 is a flowchart of an example process 200 for processing data on a memory controller. For convenience, the process 200 will be described as being performed by a memory controller configured to read from and write to a plurality of memory devices in accordance with this specification. For example, the memory controller 100 of FIG. 1, appropriately programmed, can perform the process 200.

The memory controller obtains 210 a first request and a second request to access a first memory device of the plurality of memory devices. The requests specify data of different sizes, for example ranging from 32 bytes to 512 bytes, to be accessed by the memory controller, although specific sizes can vary from implementation-to-implementation.

The memory controller is configured to reduce the number of cycles in accessing the first memory device by alternating accesses to data stored on different banks of the same memory device.

The memory controller initiates interleaved processing 220 of the first and the second requests. Before the memory controller receives an indication to stop processing requests, the memory controller is configured to continuously replace processed requests with data corresponding to new requests and accessed from the first memory device. Because the first and second requests need not be the same size, the memory controller will often finish processing the shorter request while interleaving the shorter request with a longer request, and begin interleaving the remaining portion of the longer request with corresponding data of a new request. Depending on the hardware specification of the memory devices, the memory controller selects the new request corresponding to data stored on a memory bank of the first memory device different than the longer request still being processed.

While processing the first and the second requests, the memory controller receives 230 an indication to stop accessing the first memory device and to begin accessing a second memory device. The memory controller can maintain a data-access constraint for accessing a memory device of the plurality of memory devices for a pre-determined period of time, before switching to another memory device. The subsequent memory device for the controller to access can be any memory device that is not the first memory device. The controller can select the next memory device randomly or by any other suitable method, e.g., sequentially by identifier corresponding to each of the memory devices.

The memory controller determines 240 that one or both of the first and the second requests have not been fully processed at the time of receiving the indication. Not fully processed means that there is some remaining portion of the data of the first request, the second request, or both requests that has not yet been interleaved by the memory controller at the time the memory controller receives the indication.

In response to determining that a remaining portion of data corresponding to the first or second request remains, the memory controller stores 250 data identifying data corresponding to the requests which has not been fully processed. In some implementations, the identifying data is the remaining portion of data corresponding to the first and second requests which has not been fully processed. In some implementations, instead of storing the remaining portion, the memory controller stores one or more memory addresses corresponding to the location of the remaining portion in the first memory device. In effect, the memory controller "chops off" the remaining portion of the data corresponding to the requests that were being processed at the time of receiving the indication, to later return to when the memory controller switches back to the first memory device.

The memory controller begins accessing 260 the second memory device of the plurality of memory devices. The controller begins interleaving chunks of data from requests corresponding to data stored on the second memory device, until receiving an indication to stop accessing the second memory device.

At this point, the indication received from the memory controller to stop accessing the second memory device can also be an indication to either: (i) begin accessing data at the first memory device, or (ii) begin accessing data at a third memory device of the plurality of memory devices. Regardless of whether the indication corresponds to (i) or (ii), above, the memory controller responds to the indication by determining whether the data for the requests at the time of receiving the indication have been fully processed. If not, the memory controller stores data (as the remaining portion not yet fully processed, or as addresses corresponding to the remaining portions) identifying data corresponding to the requests.

If the memory controller receives an indication to begin accessing data at the first memory device, then the memory controller next determines whether portions of data corresponding to requests to access the first memory device were stored in memory. If so, the memory controller resumes processing by first processing the remaining portions of data previously determined to have been stored.

If the memory controller receives an indication to begin accessing data at a third memory device, then the memory controller begins accessing data to process the third memory device. The memory controller continues accessing the third memory device until receiving an indication, which will either be to a previously accessed device, i.e., the first or second memory device, or to a fourth device not previously accessed by the memory controller.

Although the description above assumed that the memory controller interleaved data from two requests at a time for each memory device, in some implementations the techniques described in this specification are extended for an arbitrary number of requests corresponding to the same memory device. In those implementations, the memory controller interleaves chunks of data in the output that alternates between each request, e.g., data from a first request, a second request, a third request, back to the first request, and so on.

Figure 3:
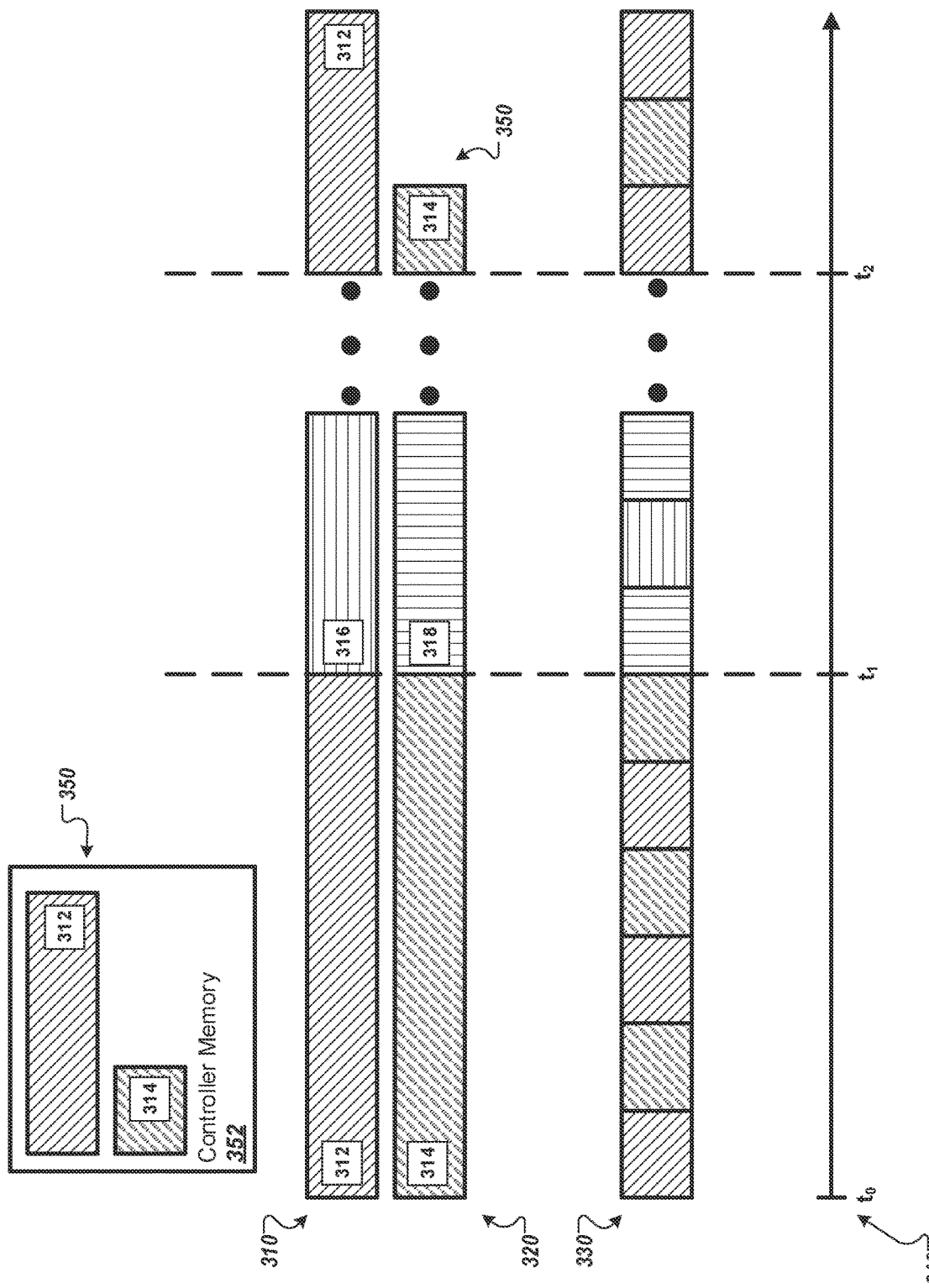
FIG. 3 is an illustration of data processed across two memory devices by a memory controller.

FIG. 3 is an illustration of data processed across two memory devices by a memory controller. Row 310 and row 320 represent data received by the memory controller corresponding to different memory devices over a period of time. Row 330 represents the interleaved output generated by memory controller using the data illustrated in rows 310 and 320.

Requests 312 and 314 are requests to process data from a first and second memory bank, respectively, of a first memory device. Data for the request 312 is represented by right-diagonal lines in the row 310, while data for the request 314 is represented by left-diagonal lines in the row 320. For clarity, requests shown in FIG. 3 begin and end with a respective reference numeral, representing the beginning and end of the data segment corresponding to the request.

Requests 316 and 318 are requests to access data from a first and second memory bank, respectively, of a second memory device. Data for the request 316 is represented by horizontal lines in the row 310, while data for the request is represented by vertical lines in the row 320.

Referring to time $t_0$ in timeline 340 illustrated in FIG. 3, the memory controller initially receives the requests 312 and 314 and begins interleaved processing of the corresponding data. From time $t_0$ to time $t_1$, the memory controller processes data from the requests 312 and 314, resulting in alternating chunks of data as shown in the segment of row 330, up until time $t_1$. At time $t_1$, the memory controller receives an indication to stop accessing the first memory device, and to begin accessing the second memory device. The memory controller determines whether there is remaining data to be processed from the requests 312 and 314 that the controller was processing at time $t_1$. In this case, there is a remaining portion 350 for both the request 314 and the request 312. The memory controller stores the remaining portion 350 in memory 352 accessible to the controller, and proceeds to access and process data from the second memory device. Beginning at time $t_1$ and until time $t_2$, the memory controller processes the data corresponding to the requests 316 and 318. The dots in the illustration before time $t_2$ represent the passage of time between $t_1$ and $t_2$.

At time $t_2$, the memory controller receives an indication to stop accessing data from the second memory device, and to begin accessing the first memory device. If the memory controller determines that the requests being processed at time $t_2$ were not fully processed, then the memory controller will store the remaining portion of the requests from the second memory device. Upon switching back to the first memory device, the memory controller determines whether there is a remaining portion of data left un-processed when the first switch occurred at time $t_1$. In this example, the memory controller determines that it previously stored the remaining portion 350 in memory, and beginning from time $t_2$, processes the remaining portion 350 before receiving new requests from the first memory device.

In some implementations, the memory controller defers switching from one memory device to another upon receiving an indication. Instead, the memory controller processes the remaining portions of the current requests until one of the requests is fully processed. Then, the memory controller stores the remaining portion of the request that was not fully processed before switching to the indicated memory device.

By delaying the switch until one of the requests is fully processed, the memory controller can reduce the process latency for the request that is fully processed since the data for the fully serviced request can be sent back to target device. In some implementations it can be advantageous to delay the switch until only one of the requests is fully processed, instead of waiting for both requests. This is because one request may be fully processed long before the second request, therefore the second request is processed without interleaving a subsequent third request, resulting in wasted bandwidth.

This issue is worsened when the memory controller switches between more than two memory devices, or when the request is to process a particularly large segment of data. In the latter case, processing of the large segment of data may be interrupted multiple times by memory device switches, further delaying the time to fully process a request.

Switches from one source of data to another source are not limited to switches between memory devices. In general, the subject matter described above can be implemented to facilitate switches from banks or channels within a memory device, or between any sources of saved memory in which the memory controller cannot successively read from or write to the same source of data in back-to-back cycles.

Figure 4:
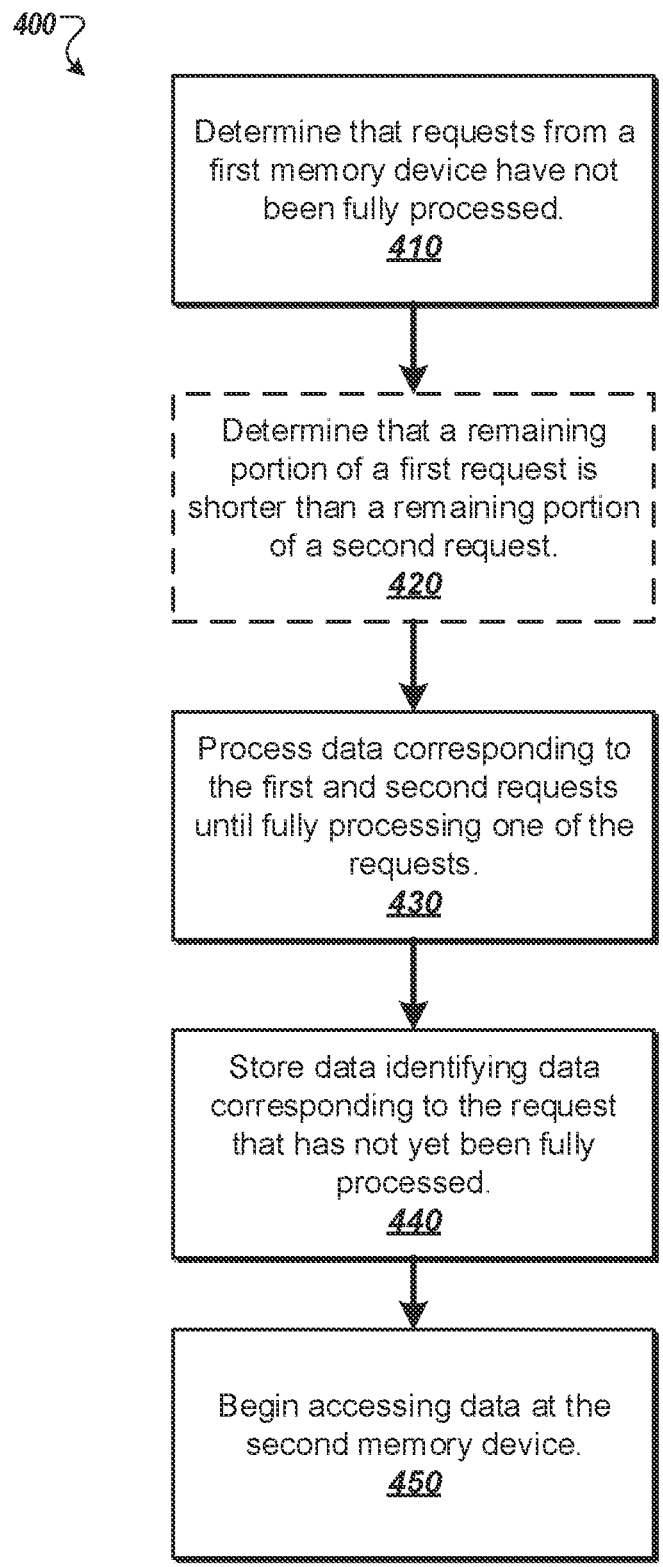
FIG. 4 is a flowchart of an example process for processing data by a memory controller by delaying the switch to a different memory device.

FIG. 4 is a flowchart of an example process 400 for processing data by a memory controller by delaying the switch to a different memory device. For convenience, the process 400 will be described as being performed by a memory controller configured to read from and write to a plurality of memory devices in accordance with this specification. For example, the memory controller 100 of FIG. 1, appropriately programmed, can perform the process 400.

After receiving an indication to stop accessing data from a first memory device, the memory controller determines 410 that data for requests that were being processed at the time of receiving the indication have not yet been fully processed.

Upon determining that data for the requests have not yet been fully processed, the memory controller optionally determines 420 that a remaining portion of a first request currently being processed is shorter than a remaining portion of a second request also currently being processed, e.g., by tracking the remaining portion of data corresponding to each request while processing the requests. A shorter remaining portion indicates that the memory controller will finish processing the shorter portion before the longer portion.

In some implementations, instead of making the determination, the memory controller continues processing until data for one of the requests is fully processed. Making the determination allows the memory controller to further determine whether it should delay the switch at all, as described in more detail, below. Alternatively or in addition, the controller is configured to switch after some fixed delay, e.g., a number of iterations/cycles or a period of time, or after some dynamically-adjusted delay, e.g., an adjusted delay in response to the memory controller load-balancing requests processed for each memory device.

Upon determining that the remaining portion of data corresponding to the first request is shorter than the remaining portion of the second request, the memory controller processes 430 the first and second requests until fully processing one of the requests. In some implementations, the memory controller determines whether the difference in size of the remaining portions meets a threshold difference, and only proceeds to process the shorter remaining portion if it meets the threshold. In some implementations, if the remaining portions for data corresponding to each request does not meet the threshold difference, e.g., because the remaining portions are of the same size, then the memory controller proceeds to process both requests to completion by delaying the switch in memory device until the longer remaining portion or "chop off" both requests without delaying the switch in memory device.

The memory controller stores 440 data identifying data corresponding to the request that has not yet been fully processed. As described above with reference to FIG. 2, the memory controller can store the remaining portion of the data for the second request (in this example, the first request is fully processed first) in memory accessible to the controller, or the memory controller can store a memory address of the location of the remaining portion in the corresponding memory device.

The memory controller begins accessing 450 data at the second memory device. The memory controller processes data as described above with reference to FIG. 2, until receiving an indication to stop accessing data at the second memory device. In some implementations, the indication received from the memory controller is an indication to switch from reading to writing data.

Figure 5:
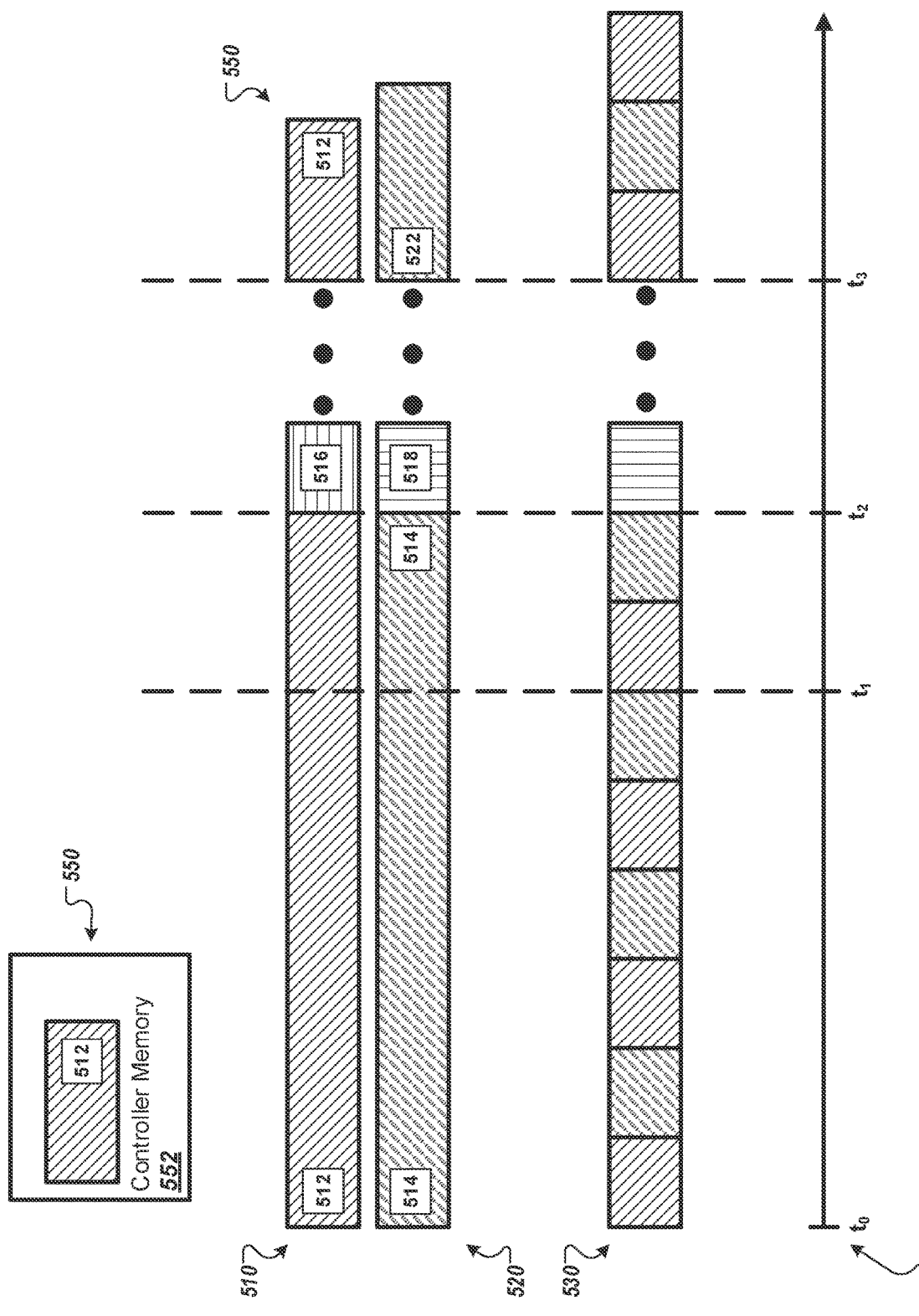
FIG. 5 is an illustration of data processed across two memory devices by a memory controller when the memory controller delays the switch to a different memory device.

FIG. 5 is an illustration of data processed across two memory devices by a memory controller when the memory controller delays the switch to a different memory device. Row 510 and row 520 represent data received by the memory controller corresponding to different memory devices over a period of time. Row 530 represents the interleaved output generated by memory controller using the data illustrated in rows 510 and 520.

Similar to the description of FIG. 3, above, requests 512 and 514 are requests to access data represented by right-diagonal and left-diagonal lines, respectively, of a first memory device. Requests 516 and 518 are requests to access data of a second memory device and are represented by horizontal and vertical lines, respectively. For clarity, requests shown in FIG. 5 begin and end with a respective reference numeral, representing the beginning and end of the data corresponding to the request.

At time $t_0$ the memory controller begins processing data corresponding to the requests 512 and 514. At time $t_1$, the memory controller receives an indication to stop accessing data at the first memory device. The memory controller determines that there are remaining portions of the data for requests 512 and 514 to still process. From time $t_1$ to time $t_2$, the memory controller processes the remaining portions of the data for requests 512 and 514 until reaching the end of one of the remaining portions. At time $t_2$, the memory controller fully processes data for the request 514. Then, the memory controller saves a remaining portion 550 of data corresponding to the request 512. The controller stores in memory 552 accessible to the controller the remaining portion 550. In some implementations, instead of storing the remaining portion 550, the controller stores the address for the remaining portion 550.

From time $t_2$ to time $t_3$, the memory controller processes data for the requests 516 and 518, by accessing the data from the second memory device. The dots in the illustration before time $t_3$ represent the passage of time between $t_2$ and $t_3$.

At time $t_3$, the memory controller receives an indication to stop accessing the second memory device, and to begin accessing data in the first memory device. In response, the memory controller delays the switch from the second memory device and stores the remaining portion of the requests that were being processed at time $t_2$, if any. Then, the memory controller determines whether a remaining portion of data from the first memory device was stored. In this case, the memory controller determines that the remaining portion 550 was previously stored, and resumes processing beginning with the remaining portion 550. Since the remaining portion is only of a single request (request 512), the memory controller also receives a new request 522 to process alongside the remaining portion 550.

Embodiments of the subject matter and the actions and operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively or in addition, the carrier may be an artificially-generated propagated signal, e.g., a machine-generated electrical, optical, or electromagnetic signal that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

The term "data processing apparatus" encompasses all kinds of apparatus, devices, and machines for processing data, including by way of example a programmable processor, a computer, or multiple processors or computers. Data processing apparatus can include special-purpose logic circuitry, e.g., an FPGA (field programmable gate array), an ASIC (application-specific integrated circuit), or a GPU (graphics processing unit). The apparatus can also include, in addition to hardware, code that creates an execution environment for computer programs, e.g., code that constitutes processor firmware, a protocol stack, a database management system, an operating system, or a combination of one or more of them.

A computer program can be written in any form of programming language, including compiled or interpreted languages, or declarative or procedural languages; and it can be deployed in any form, including as a stand-alone program, e.g., as an app, or as a module, component, engine, subroutine, or other unit suitable for executing in a computing environment, which environment may include one or more computers interconnected by a data communication network in one or more locations.

A computer program may, but need not, correspond to a file in a file system. A computer program can be stored in a portion of a file that holds other programs or data, e.g., one or more scripts stored in a markup language document, in a single file dedicated to the program in question, or in multiple coordinated files, e.g., files that store one or more modules, sub-programs, or portions of code.

The processes and logic flows described in this specification can be performed by one or more computers executing one or more computer programs to perform operations by operating on input data and generating output. The processes and logic flows can also be performed by special-purpose logic circuitry, e.g., an FPGA, an ASIC, or a GPU, or by a combination of special-purpose logic circuitry and one or more programmed computers.

Computers suitable for the execution of a computer program can be based on general or special-purpose microprocessors or both, or any other kind of central processing unit. Generally, a central processing unit will receive instructions and data from a read-only memory or a random access memory or both. The essential elements of a computer are a central processing unit for executing instructions and one or more memory devices for storing instructions and data. The central processing unit and the memory can be supplemented by, or incorporated in, special-purpose logic circuitry.

Generally, a computer will also include, or be operatively coupled to, one or more mass storage devices, and be configured to receive data from or transfer data to the mass storage devices. The mass storage devices can be, for example, magnetic, magneto-optical, or optical disks, or solid state drives. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

To provide for interaction with a user, embodiments of the subject matter described in this specification can be implemented on one or more computers having, or configured to communicate with, a display device, e.g., a LCD (liquid crystal display) or organic light-emitting diode (OLED) monitor, a virtual-reality (VR) or augmented-reality (AR) display, for displaying information to the user, and an input device by which the user can provide input to the computer, e.g., a keyboard and a pointing device, e.g., a mouse, a trackball or touchpad. Other kinds of devices can be used to provide for interaction with a user as well; for example, feedback and responses provided to the user can be any form of sensory feedback, e.g., visual, auditory, speech or tactile; and input from the user can be received in any form, including acoustic, speech, or tactile input, including touch motion or gestures, or kinetic motion or gestures or orientation motion or gestures. In addition, a computer can interact with a user by sending documents to and receiving documents from a device that is used by the user; for example, by sending web pages to a web browser on a user's device in response to requests received from the web browser, or by interacting with an app running on a user device, e.g., a smartphone or electronic tablet. Also, a computer can interact with a user by sending text messages or other forms of message to a personal device, e.g., a smartphone that is running a messaging application, and receiving responsive messages from the user in return.

This specification uses the term "configured to" in connection with systems, apparatus, and computer program components. That a system of one or more computers is configured to perform particular operations or actions means that the system has installed on it software, firmware, hardware, or a combination of them that in operation cause the system to perform the operations or actions. That one or more computer programs is configured to perform particular operations or actions means that the one or more programs include instructions that, when executed by data processing apparatus, cause the apparatus to perform the operations or actions. That special-purpose logic circuitry is configured to perform particular operations or actions means that the circuitry has electronic logic that performs the operations or actions.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of what is being claimed, which is defined by the claims themselves, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A system comprising:
   a plurality of memory devices;
   a memory controller configured to read from and write to at least the plurality of memory devices and perform operations comprising:
   obtaining a first request to access a first data of a first size corresponding to the first request and a second request to access a second data of a second size corresponding to the second request at a first memory device of the plurality of memory devices; and
   initiating interleaved processing of the respective data corresponding to the first and second requests, wherein the interleaved processing comprises alternating between accessing chunks of the first data corresponding to the first request and accessing chunks of the second data corresponding to the second request;
   receiving an indication to stop processing requests to access data at the first memory device and to initiate processing requests to access data at a second memory device of the plurality of memory devices;
   determining that the respective data corresponding to the first and second requests have not yet been fully processed at the time of receiving the indication; and
   in response, performing operations for remaining portions of the first data and the second data, the performing comprising:
      when the remaining portions satisfy a criterion, continuing the interleaved processing until a shorter one of the first data and the second data has been fully processed, and storing a new remaining portion of a longer one of the first data and the second data in memory; and
      when the remaining portions do not satisfy the criterion, storing the remaining portions of the first data and the second data in memory for a particular amount of time, and
   after the particular amount of time, resuming the interleaved processing of the remaining portions at the first memory device until a shorter one of the first data and the second data has been fully processed.

2. The system of claim 1, wherein interleaved processing of the respective data corresponding to the first and the second requests comprises generating an interleaved output comprising chunks of data that alternate between the chunks of the first data corresponding to the first request and the chunks of the second data corresponding to the second request.

3. The system of claim 1, wherein the criterion comprises a threshold value for the difference in size of the remaining portions of two data.

4. The system of claim 1, wherein the operations further comprise streaming the interleaved output to access one or more memory devices storing data corresponding to requests interleaved in the interleaved output.

5. The system of claim 1, wherein the chunks of data of the interleaved output are of a uniform size.

6. The system of claim 1, wherein the operations further comprise:
   after fully processing the shorter one of the first data and the second data, initiating another interleaved processing of (i) a remainder of the longer one of the first data and the second data and (ii) a new data corresponding to a respective request at the first memory device.

7. The system of claim 1, wherein the indication is a first indication, and wherein the operations further comprise:
   obtaining a third request to access a third data of a third size corresponding to the third request and a fourth request to access a fourth data of a fourth size corresponding to the fourth request at the second memory device of the plurality of memory devices; and
   initiating interleaved processing of the respective data corresponding to the third and fourth requests,
   wherein the interleaved processing comprises alternating between accessing chunks of the third data corresponding to the third request and accessing chunks of the fourth data corresponding to the fourth request;
   receiving a second indication from the memory controller to stop processing requests to access data at the second memory device and to initiate processing requests to access data at the first memory device;
   determining that the respective data corresponding to the third and the fourth requests have not yet been fully processed at the time of receiving the second indication, and
   in response, performing operations for remaining portions of the third data and the fourth data according to a criterion, the performing comprising:
      when the remaining portions satisfy the criterion, continuing the interleaved processing until a shorter one of the third data and the fourth data has been fully processed, and storing a new remaining portion of a longer one of the third data and the fourth data in memory; and
      when the remaining portions do not satisfy the criterion, storing the remaining portions of the third data and the fourth data in memory for another particular amount of time, and
   after the other particular amount of time, resuming the interleaved processing of the remaining portions at the second memory device until a shorter one of the third data and the fourth data has been fully processed.

8. The system of claim 7, wherein the operations further comprise:
   after receiving the second indication from the memory controller, obtaining a fifth request to access a fifth data of a fifth size corresponding to the fifth request and a sixth request to access a sixth data of a sixth size corresponding to the sixth request at the first memory device; and
   initiating the interleaved processing of respective data corresponding to the fifth and the sixth requests.

9. A method performed by a memory controller configured to read from and write to a plurality of memory devices, the method comprising:
   obtaining a first request to access a first data of a first size corresponding to the first request and a second request to access a second data of a second size corresponding to the second request at a first memory device of the plurality of memory devices; and
   initiating interleaved processing of the respective data corresponding to the first and second requests, wherein the interleaved processing comprises alternating between accessing chunks of the first data corresponding to the first request and accessing chunks of the second data corresponding to the second request;
   receiving an indication to stop processing requests to access data at the first memory device and to initiate processing requests to access data at a second memory device of the plurality of memory devices;

determining that the respective data corresponding to the first and second requests have not yet been fully processed at the time of receiving the indication; and in response, performing operations for remaining portions of the first data and the second data, the performing comprising:

determining that the remaining portions satisfy a criterion, in response to determining that the remaining portions satisfy the criterion, continuing the interleaved processing until a shorter one of the first data and the second data has been fully processed, and storing a new remaining portion of a longer one of the first data and the second data in memory.

10. The method of claim 9, wherein interleaved processing of the respective data corresponding to the first and the second requests comprises generating an interleaved output comprising chunks of data that alternate between the chunks of the first data corresponding to the first request and the chunks of the second data corresponding to the second request.

11. The method of claim 9, wherein the criterion comprises a threshold value for the difference in size of the remaining portions of two data.

12. The method of claim 9, wherein the operations further comprise streaming the interleaved output to access one or more memory devices storing data corresponding to requests interleaved in the interleaved output.

13. The method of claim 9, wherein the chunks of data of the interleaved output are of a uniform size.

14. The method of claim 9, further comprising:

after fully processing the shorter one of the first data and the second data, initiating another interleaved processing of (i) a remainder of the longer one of the first data and the second data and (ii) a new data corresponding to a respective request at the first memory device.

15. One or more non-transitory computer-readable storage media encoded with instructions that, when executed by a memory controller configured to read from and write to a plurality of memory devices, causes the memory controller to perform operations, the operations comprising:

obtaining a first request to access a first data of a first size corresponding to the first request and a second request to access a second data of a second size corresponding to the second request at a first memory device of the plurality of memory devices; and initiating interleaved processing of the respective data corresponding to the first and second requests, wherein the interleaved processing comprises alternating between accessing chunks of the first data corresponding to the first request and accessing chunks of the second data corresponding to the second request;

receiving an indication to stop processing requests to access data at the first memory device and to initiate processing requests to access data at a second memory device of the plurality of memory devices;

determining that the respective data corresponding to the first and second requests have not yet been fully processed at the time of receiving the indication; and in response, performing operations for remaining portions of the first data and the second data, the performing comprising:

when the remaining portions satisfy a criterion, continuing the interleaved processing until a shorter one of the first data and the second data has been fully processed, and storing a new remaining portion of a longer one of the first data and the second data in memory; and when the remaining portions do not satisfy the criterion, storing the remaining portions of the first data and the second data in memory for a particular amount of time, and after the particular amount of time, resuming the interleaved processing of the remaining portions at the first memory device until a shorter one of the first data and the second data has been fully processed.

16. The computer-readable storage media of claim 15, wherein interleaved processing of the respective data corresponding to the first and the second requests comprises generating an interleaved output comprising chunks of data that alternate between the chunks of the first data corresponding to the first request and the chunks of the second data corresponding to the second request.

17. The computer-readable storage media of claim 15, wherein the criterion comprises a threshold value for the difference in size of the remaining portions of two data.

18. The computer-readable storage media of claim 15, wherein the operations further comprise streaming the interleaved output to access one or more memory devices storing data corresponding to requests interleaved in the interleaved output.

19. The computer-readable storage media of claim 15, wherein the chunks of data of the interleaved output are of a uniform size.

20. The computer-readable storage media of claim 15, wherein the operations further comprise:

after fully processing the shorter one of the first data and the second data, initiating another interleaved processing of (i) a remainder of the longer one of the first data and the second data and (ii) a new data corresponding to a respective request at the first memory device.

* * * * *